(12) United States Patent
Val et al.

(10) Patent No.: US 12,188,632 B2
(45) Date of Patent: Jan. 7, 2025

(54) ASSEMBLY OF LIGHT SOURCES, MOTOR VEHICLE LIGHTING DEVICE COMPRISING SAME AND METHOD FOR MANUFACTURING SUCH AN ASSEMBLY

(71) Applicant: VALEO VISION, Bobigny (FR)

(72) Inventors: Alexandre Val, Bobigny (FR); Amine Alili, Bobigny (FR); Samya Belkessam, Bobigny (FR)

(73) Assignee: Valeo Vision, Bobigny (FR)

( * ) Notice: Subject to any disclaimer, the term of this patent is extended or adjusted under 35 U.S.C. 154(b) by 343 days.

(21) Appl. No.: 17/773,979

(22) PCT Filed: Oct. 14, 2020

(86) PCT No.: PCT/EP2020/078975
§ 371 (c)(1),
(2) Date: Nov. 18, 2022

(87) PCT Pub. No.: WO2021/089286
PCT Pub. Date: May 14, 2021

(65) Prior Publication Data
US 2023/0129054 A1    Apr. 27, 2023

(30) Foreign Application Priority Data
Nov. 6, 2019    (FR) ...................................... 1912436

(51) Int. Cl.
*F21S 45/47* (2018.01)
*F21S 41/141* (2018.01)
(Continued)

(52) U.S. Cl.
CPC ............. *F21S 45/47* (2018.01); *F21S 41/141* (2018.01); *F21S 41/192* (2018.01); *F21V 29/70* (2015.01);
(Continued)

(58) Field of Classification Search
CPC ........ F21S 45/47; F21S 41/141; F21S 41/192; F21S 41/153; F21V 29/70; F21V 29/89;
(Continued)

(56) References Cited

U.S. PATENT DOCUMENTS 7,812,363 B2    10/2010   Higashi
8,633,643 B2    1/2014    Lee et al.
(Continued)

FOREIGN PATENT DOCUMENTS

CN        107044608 A    8/2017
EP        3203138 A1     8/2017
(Continued)

OTHER PUBLICATIONS

Japanese Patent Office, Office Action (with English translation) and Written Opinion of corresponding Japanese Application No. 2022-525882, dated Apr. 25, 2023.
(Continued)

*Primary Examiner* — Zheng Song
*Assistant Examiner* — Glenn D Zimmerman
(74) *Attorney, Agent, or Firm* — Valeo Vision

(57) ABSTRACT

The invention relates to an assembly of light sources including an integrated circuit with a connection pad, a light-emitting part with micro-LEDs and an active surface, a fan-out encapsulation surrounding at least a part of the integrated circuit, a first multilayer metal layer, a second metal layer that includes contact parts being in direct contact with a rear face of the integrated circuit, a heat sink, a matrix fixation layer arranged between the second metal layer and the heat sink and a printed circuit board. The first metal layer is arranged so as to cover at least a part of the front face of the integrated circuit, providing an electrical connection between the pad of the integrated circuit and a pad of the assembly.

17 Claims, 3 Drawing Sheets

(51) Int. Cl.
  *F21S 41/19*   (2018.01)
  *F21V 29/70*   (2015.01)
  *F21V 29/89*   (2015.01)
  *F21Y 115/10*  (2016.01)
  *H01L 33/64*   (2010.01)

(52) U.S. Cl.
  CPC ............ *F21V 29/89* (2015.01); *H01L 33/644* (2013.01); *F21Y 2115/10* (2016.08)

(58) Field of Classification Search
  CPC ..... H01L 33/644; H01L 25/167; H01L 33/62; H01L 25/0753; H01L 33/505; H01L 33/64; H01L 33/641; H01L 33/642; F21Y 2115/10; H05K 2201/10416; H05K 1/0204
  See application file for complete search history.

(56) References Cited

U.S. PATENT DOCUMENTS

| | | | |
|---|---|---|---|
| 9,388,951 B2* | 7/2016 | Yamada | H05K 1/144 |
| 10,082,265 B2* | 9/2018 | Duarte | F21S 41/192 |
| 10,403,611 B2 | 9/2019 | Wong et al. | |
| 2008/0291688 A1* | 11/2008 | Higashi | H01L 25/0753 362/545 |
| 2017/0227186 A1 | 8/2017 | Duart et al. | |
| 2019/0208616 A1* | 7/2019 | Thin | F21S 41/192 |
| 2020/0266180 A1* | 8/2020 | Pendse | H01L 24/20 |
| 2021/0134773 A1 | 5/2021 | Onuma et al. | |
| 2022/0384492 A1* | 12/2022 | Lu | H01L 27/15 |

FOREIGN PATENT DOCUMENTS

| | | |
|---|---|---|
| JP | 2008294181 A | 4/2008 |
| JP | 2017183649 A | 10/2017 |
| JP | 2019153723 A | 9/2019 |
| WO | 2019031183 A1 | 2/2019 |

OTHER PUBLICATIONS

M. Shih et al., "Electrical, Thermal, and Mechanical Characterization of eWLB, Fully Molded Fan-Out Package, and Fan-Out Chip Last Package," in IEEE Transactions on Components, Packaging and Manufacturing Technology, vol. 9, No. 9, pp. 1765-1775, Sep. 2019, doi: 10.1109/TCPMT.2019.2935477.

Japanese Patent Office, Search Report (with English translation) of corresponding Japanese Application No. 2022-525882, dated Apr. 26, 2023.

European Patent Office, International Search Report and Written Opinion of corresponding international application No. PCT/EP2020/078975, dated Nov. 26, 2020.

Kuisma, Heikki et al, "FO-WLP multi-DOF inertial sensor for automotive applications", 2018 7th Electronic System-Integration Technology Conference (ESTC), IEEE, Sep. 18, 2018, pp. 1-7.

Lau, John H, "Patent issues of embedded fan-out wafer/panel level packaging", 2016 China Semiconductor Technology International Conference (CSTIC), IEEE, Mar. 13, 2016, p. 1-7.

\* cited by examiner

ASSEMBLY OF LIGHT SOURCES, MOTOR VEHICLE LIGHTING DEVICE COMPRISING SAME AND METHOD FOR MANUFACTURING SUCH AN ASSEMBLY

CROSS-REFERENCE TO RELATED APPLICATIONS

This application is filed under 35 U.S.C. § 371 U.S. National Phase of International Application No. PCT/EP2020/078975 filed Oct. 14, 2020 (published as WO2021089286), which claims priority benefit to French application No. 1912436 filed on Nov. 6, 2019, the disclosures of which are herein incorporated by reference in their entirety.

TECHNICAL FIELD

This invention relates to the field of producing motor vehicle lighting devices and to the methods pertaining thereto.

BACKGROUND OF THE INVENTION

High-end motor vehicle manufacturers are increasingly using arrays of light-emitting diodes (LEDs) for motor vehicle lighting functionalities. These arrangements are achieved by way of complex processes or through the arrangement of optical modules that house multiple LEDs which are mounted on a heat sink as individual devices, or are arranged in an array of single LED devices. Each individual LED is supplied with power by a dedicated driver which comprises an interface with a microcontroller for managing the dynamics of the light beam via software routines. This approach may be used for tens of light beams but, as resolution requirements are becoming increasingly high, this arrangement cannot be applied for highly pixelated light sources (such as those comprising thousands of light sources) under motor vehicle cost, production and design flexibility constraints.

As a result, motor vehicle LED devices are much more conservative than in other lighting applications.

US 2011/0127912 A1 shows the importance of heat dissipation in the production of an LED array for a motor vehicle. However, this method has limitations as to the number of LEDs that may be included in a single lighting device.

A solution to this problem is sought.

BRIEF SUMMARY OF THE INVENTION

The invention provides a solution to this problem by means of an assembly of light sources as claimed in claim 1, a motor vehicle lighting device as claimed in claim 13 and a method for producing the assembly of light sources as claimed in claim 14. The preferred embodiments of the invention are defined in dependent claims.

Unless otherwise defined, all terms (including technical and scientific terms) used in this document should be interpreted in accordance with the standard practices of the profession. It is also understood that terms in common use are to be interpreted as customary in the relevant art and not in an idealized or overly formal sense, unless expressly defined as such herein.

In this text, the term "comprises" and derivatives thereof (such as "comprising", etc.) should not be understood in an exclusive sense, i.e. these terms should not be interpreted as excluding the possibility that what is described and defined may include other elements, steps, etc.

In a first inventive aspect, the invention provides an assembly of light sources for a motor vehicle lighting device, the assembly comprising:
 providing
  an integrated circuit having a first side and a second side opposite the first side, further comprising a pad in the first side;
  a light-emitting part comprising a plurality of micro semiconductor light sources which are electrically connected to the first side of the integrated circuit and an active surface arranged so as to modify the wavelength of the micro semiconductor light sources;
  a fan-out packaging, surrounding at least part of the integrated circuit;
  a first multilayer metal layer arranged so as to cover at least part of the first side of the integrated circuit, providing an electrical connection between the pad of the integrated circuit and a pad of the assembly;
  a second metal layer comprising contact portions which are in direct contact with the second face of the integrated circuit;
  a heat sink element;
  an array bonding layer arranged between the metal layer and the heat sink element; and
  a printed circuit board.

This assembly of light sources addresses the thermal problems due to the presence of a large number of micro LEDs.

In addition, the presence of a metal layer on each side of the integrated circuit is also intended to control deformation. Thus, the production process is improved.

The term "semiconductor" refers to light emitted by solid-state electroluminescence, which uses semiconductors to convert electricity into light. In comparison with incandescent lighting, solid-state lighting generates visible light with lower heat production and less energy dissipation. The generally low weight of a solid-state electronic lighting device affords greater resistance to impacts and vibrations than brittle glass tubes/bulbs and long, thin filament wires. They are also not subject to filament evaporation, which may increase the service life of the lighting device. Some examples of these types of lighting comprise solid-state light-emitting diodes (LEDs), organic light-emitting diodes (OLEDs), or polymer light-emitting diodes (PLEDs) as light sources instead of electrical filaments, plasma or gas.

The "heat sink element" may be a heat sink, base plate, heat pipe, or other suitable thermal diffusers.

In particular, the second metal layer comprises copper and a finish made of nickel, palladium and gold.

In the motor vehicle environment, no bare copper connections may be exposed to the environment, which is why this type of finish is used.

In some models, the active surface is arranged in a plane parallel to the first and second sides of the integrated circuit.

The coplanarity of the pads (anode and cathode) on the first side of the integrated circuit is controlled so as to ensure that the thousands of connections are made with precision.

In some particular embodiments, the second metal layer is parallel to the active surface.

This condition facilitates the production process.

In some particular embodiments, the distance between the pad of the assembly and the active surface is between 2 mm and 4 mm.

This smaller distance contributes to simplifying the masking system which is placed above to avoid any directly incident light, such as due to optical reflection from the wire or ribbon.

In some particular embodiments, the second side of the integrated circuit is partially covered by the fan-out packaging, and the second metal layer comprises metal projections which pass through fan-out packaging to come into contact with the second side of the integrated circuit.

This arrangement affords good thermal resistance and, at the same time, back protection for the integrated circuit. This is also advantageous for obtaining good adhesion of the second metal layer to the array tie layer. In these cases, a tie layer, such as metal sputtering, is usually applied.

In some particular embodiments, the first metal multilayer comprises at least one redistribution layer.

Currently, power supply connections are typically capable of transmitting 5 to 10 A, which corresponds to a redistribution layer made of copper 5 to 10 µm thick. The plan of the redistribution layer is designed according to the principle of shortest distance, so as to minimize the number of vias. Vias generally have a diameter of about 80 µm to be able to transmit 5 to 10 A.

In some particular embodiments, the redistribution layer is arranged around the light-emitting portion.

This provides mechanical protection and contributes to heat dissipation.

In some particular embodiments, the first metal multilayer further comprises a ribbon cable which connects the pad of the assembly to the printed circuit board.

In other cases, an alternate connection is used, such as aluminum, copper, or gold wire or a copper clip, which may be mixed to handle power and signal connections. However, if a ribbon cable is used, the wires do not need to be to protected with additional resin.

In some particular cases, the first metal multilayer comprises an integrated circuit that passes through the fan-out packaging which connects the pad of the integrated circuit to the pad of the assembly.

This conductive connection is typically made by adding a four-layer printed circuit board or a ceramic spacer, or by directly piercing a polymer through-hole, in order to make an electrical connection between the driver connection land and the terminal of the assembly, which in this case is located on the second face of the device.

In some particular cases, the array bonding layer comprises at least one element from among a silicone adhesive, a solder alloy, a silver sinter paste or metal fillers.

In the case that this assembly is used with a secondary mounting configuration, the primary functions of the array bonding layer are to transfer thermal energy with the lowest possible resistance, to provide mechanical bonding, and to ensure reliability. Since there is no electrical function, it is possible to choose a silicon adhesive or a solder alloy with metal fillers.

In the case that this assembly is used with an SMD configuration, a solder alloy or silver sinter paste should be used because, in this case, this layer also performs the function of providing an electrical connection.

In some particular cases, the active layer is a phosphor coating comprising a silicone-based material and metal particles.

Since the active layer is a critical area for the propagation of sunburn, it is highly advantageous for the surface to have a thermal conductivity higher than 50 W/m/° C. Such a phosphor coating allows the use of redistribution layers made of copper and a finish.

In a second inventive aspect, the invention provides a motor vehicle lighting device comprising a plurality of assemblies of light sources according to the first inventive aspect.

In a third inventive aspect, the invention provides a method for producing an assembly of light sources according to the first inventive aspect, the method comprising the following steps
providing an initial integrated circuit carrier;
selecting portions of the starting integrated circuit carrier that are suitable for the production of an assembly of light sources;
placing an adhesive tape on appropriate portions to form a reconstructed carrier;
placing interposers for electrical connection;
encapsulating the portions of the reconstructed carrier;
grinding the rear face of the reconstructed carrier to define the thickness or to expose the silicon rear face;
adding a second metal layer to the second face;
adding a first multilayer metal layer to the first face of the reconstructed carrier to create a connection between each integrated circuit pad and each assembly pad;
attaching a plurality of micro semiconductor light sources
dicing the multilayer.

The use of a reconstructed carrier makes it possible to apply a method where 100% of the carrier is known to be acceptable, so that the whole carrier may be populated with LED arrays. This allows improved yield and better control of deformation. In addition, the six sides of the integrated circuit are protected from environmental conditions, since the packaging and the first and second metal layers provide protection and control of deformation.

The installation of the redistribution layers at an early stage in the process, independently of the final connection of the assembly, as a sub-assembly or SMD, makes the process easier and less expensive, since yield is improved, and the final assembly of the heat sink elements is also improved.

In some particular embodiments, after the step of attaching the micro semiconductor light sources, the method further comprises at least one of the following steps
reflow process after attaching micro semiconductor light sources;
underfill deposition between the micro semiconductor light sources and the reconstructed carrier;
performing treatments on the micro semiconductor light sources, such as a surface treatment or a thinning treatment; and/or
performing opto-electrical tests.

These optional additional steps make it possible to provide an assembly optimized for a motor vehicle lighting device.

BRIEF DESCRIPTION OF THE DRAWINGS

To supplement the description and to allow better understanding of the invention, a set of drawings is provided. These drawings form an integral part of the description and illustrate one embodiment of the invention, which should not be interpreted as limiting the scope of the invention, but merely as an example of how the invention may be carried out. The drawings comprise the following figures.

DETAILED DESCRIPTION OF THE INVENTION

Figure 1:
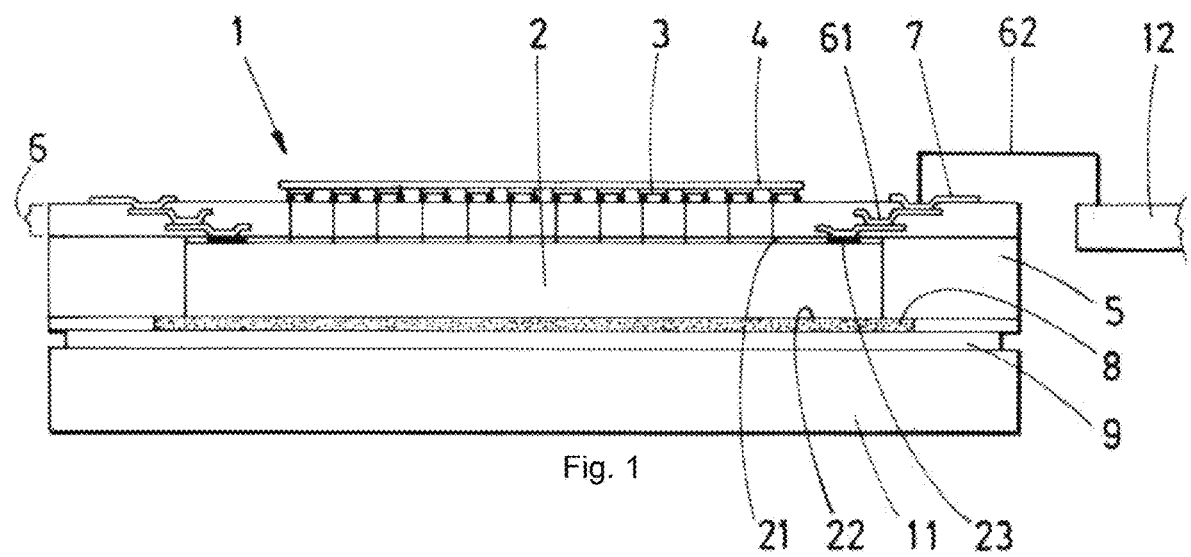
FIG. 1 shows a general approach of a first embodiment of an assembly of light sources according to the invention.

The exemplary embodiments are described in sufficient detail to allow those of ordinary skill in this art to carry out and implement the systems and processes described herein. It is important to understand that these examples may be provided in a number of different forms and should not be construed as being limited to the examples presented here.

Consequently, although the embodiment may be modified in various ways and take various alternative forms, specific embodiments thereof are shown in the drawings and described in detail below by way of example. No limitation to the particular forms disclosed is intended. Rather, all modifications, equivalents and alternatives falling within the scope of the appended claims are to be included. The elements of the exemplary embodiments are systematically denoted by the same reference numerals throughout the drawings and detailed description, where applicable.

Figure 2:
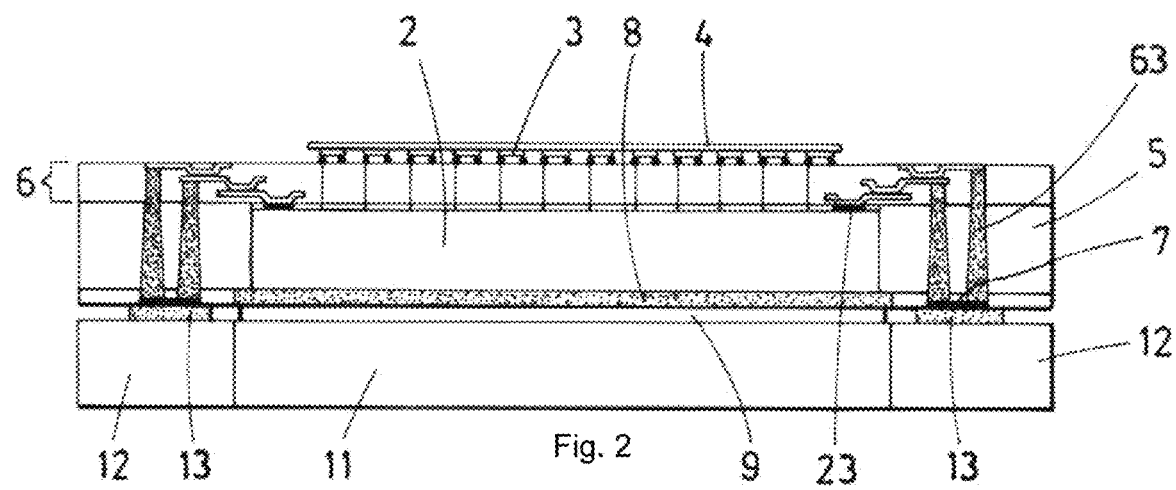
FIG. 2 shows a general approach of a first embodiment of an assembly of light sources according to the invention.

FIGS. 1 and 2 show a general approach of two embodiments of an assembly of light sources 1 according to the invention. FIG. 1 is oriented toward a submount connection, while FIG. 2 shows the incorporation intended to be connected via a connection defined by a solder mask (SMT).

The assemblies 1 illustrated in FIGS. 1 and 2 comprise an integrated circuit 2, a light-emitting portion with micro LEDs 3 and an active surface 4, a fan-out packaging 5, a first metal multilayer 6, a second metal layer 8, a chip bonding layer 9, a heat sink 11 and a printed circuit board 12.

The integrated circuit 2 is an ASIC with a first side 21 and a second side 22 opposite the first side 21 and comprises a pad 23 in the first side 21.

The light-emitting portion comprises a plurality of micro LEDs 3 which are electrically connected to the first side 21 of the integrated circuit 2, so as to receive power and control. The active surface 4 is arranged so as to modify the wavelength of the micro LEDs 3, such that the final light emission is white, as required by motor vehicle functionalities.

The fan-out packaging 5 is arranged so as to surround the integrated circuit 2. The fan-out assembly 5 is responsible for surrounding it laterally, but the second side 22 of the integrated circuit 2 is also protected by a small portion of the fan-out assembly 5.

The first metal multilayer 6 is arranged so as to cover part of the first face 21 of the integrated circuit 2. As this first metal multilayer 6 is different in each variant, it will be described in more detail later. In all cases, this first metal multilayer 6 provides an electrical connection between the pad 23 of the integrated circuit 2 and the pad 7 of the assembly.

The second metal layer 8 comprises metal projections 81 which pass through the fan-out packaging 5 so as to be in direct contact with the second side 22 of the integrated circuit 2. This second metal layer is made of copper and has a nickel finish.

The array tie layer 9 is arranged between the second metal layer 8 and the heat sink 11, and its purpose is different for each embodiment.

As can be seen in these two figures, the active surface 4 is arranged along a plane that is parallel to the first 21 and second 22 sides of the integrated circuit 2. This plane is also parallel to the second metal layer 8. This parallel arrangement is easier to design and manufacture, and also affords good structural robustness, such that these small pads are able to retain their shape despite the thermal and structural loads that they experience.

Above the micro LEDs 3, the active layer 4 comprises a phosphor coating which is deposited by sputtering. This coating is a silicone-based material filled with metal particles to give a white color to the final projected light (since the LEDs emit in the blue wavelength). In some embodiments, this coating may also be spread over redistribution layers, to play a protective role and an additional role of releasing local stress. However, this layer does not reach the pads of the assembly 7, as it would be considered a contaminant for these elements. The additional area provided by the fan-out packaging 5 helps to avoid such contamination.

FIG. 1 shows one embodiment of an assembly of light sources 1 which is particularly configured for use in a submount connection. The structure of the first metal multilayer is therefore different from that of FIG. 2.

In this figure, the first metal multilayer comprises multiple redistribution layers 61 which provide the electrical connection between the pad 23 of the driver 2 and the pad 7 of the assembly which, in this embodiment, is located on the upper face of the assembly 1.

The minimum distance between the pad 7 and the active surface 4 depends on the optical system chosen to be placed above the assembly of light sources, but may vary between 2 and 4 mm. This smaller distance contributes to simplifying the masking system which is placed above in order to avoid any directly incident light, such as due to optical reflection from the wire or ribbon 62.

Thermal problems are also mitigated by the position of the redistribution layers 61, around the light-emitting portion.

The tie layer 9 of this embodiment is intended to transfer thermal energy with the lowest possible resistance. A solder alloy paste with metal fillers is used so that the heat is easily dissipated toward the heat sink 11. In addition, this chip bonding layer 9 mechanically bonds the assembly of light sources 1 to the main structure of the lighting device, which is represented by the heat sink 11.

FIG. 2 shows another embodiment of an assembly of light sources 1, which is particularly configured for use in a connection defined by a solder mask (SMT). The structure of the first metal multilayer is therefore different from that of FIG. 1.

In this case, the first metal multilayer 6 comprises a conductive via 63 which passes through the fan-out packaging 5 connecting the pad of the driver 23 to the pad of the assembly 7, which in this case is located in the lower portion of the assembly 1.

In this case, the connection pad 7 is connected to the printed circuit board 12 by means of a bonding layer 13. As this bonding layer 13 performs an electrical function, a solder alloy is used. In various embodiments, an electrically conductive adhesive, with or without sintering, may be used for this purpose.

Figure 3:
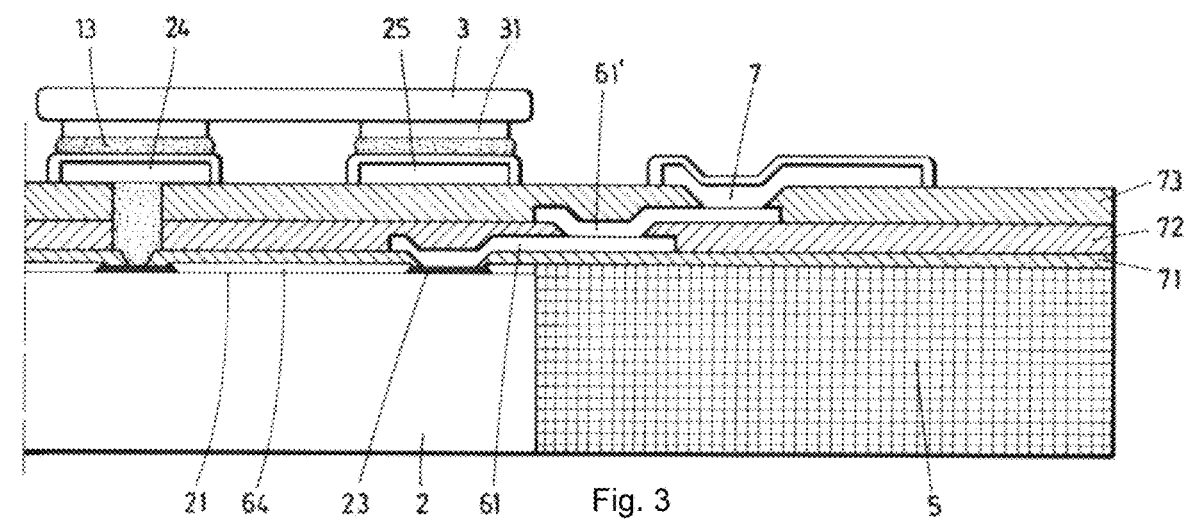
FIG. 3 shows a detail of the redistribution layers of one embodiment of an assembly of light sources according to the invention.

FIG. 3 shows a detail of the redistribution layers of one embodiment of an assembly of light sources according to the invention.

The integrated circuit 2 comprises a passivation layer 64 which is deposited on the first face 21 of the integrated circuit. The passivation layer is not applied to the pad of the driver 23, which receives the first redistribution layer 61. This first redistribution layer 61 is deposited on a first polymer layer 71, while a second polymer layer 72 is deposited on top, leaving a space for the connection of a second redistribution layer 61'. A third polymer layer 73 is deposited on this second redistribution layer 61', leaving an empty space for the third and last redistribution layer. This third redistribution layer provides the connection pad 7 of the assembly which is intended to be connected to the printed circuit board 12 by means of a ribbon cable 62, as shown in FIG. 1.

The micro LEDs 3 are connected to the anodes 24 and to the cathodes 25 of the driver by means of a solder paste 13 which connects each anode and each cathode to the connection pads of the LEDs 31.

Figure 4:
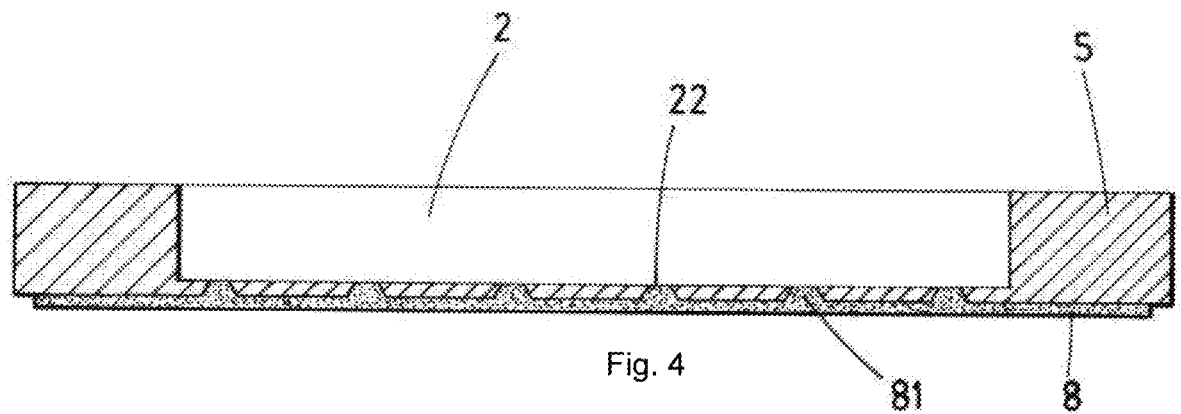
FIG. 4 shows a detail of the contact projections between two layers of an assembly of light sources according to the invention.

FIG. 4 shows a detail of the contact protuberances between two layers of an assembly of light sources according to the invention.

In this embodiment, the packaging 5 comprises a portion that covers the second side 22 of the integrated circuit 2, and the second metal layer 8 comprises metal projections 81 which pass through this portion of the packaging 5 so as to be in direct contact with the second side 22 of the integrated circuit 2. This second metal layer 8 is made of copper and has a nickel finish.

Figure 5A:
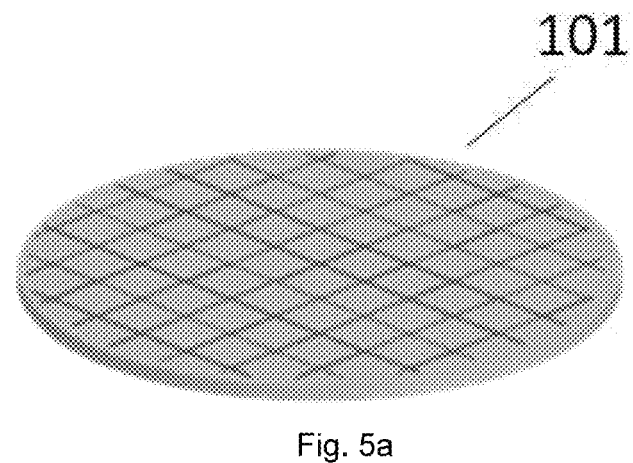
FIG. 5a, FIG. 5b, and FIG. 5c show the steps of a production method according to the invention.
Figure 5B:
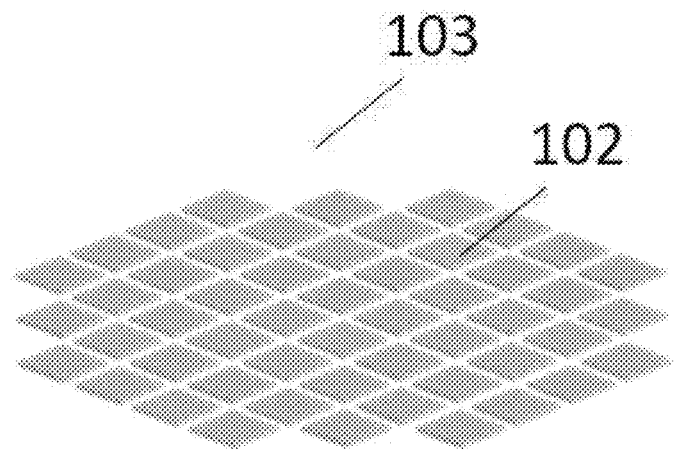
Figure 5C:
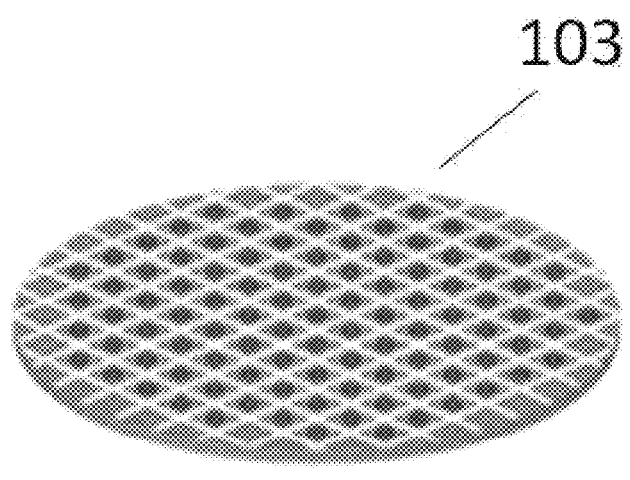

FIGS. 5a to 5c show the steps of a production method according to the invention.

FIG. 5a shows the provision of an initial carrier 101, where the integrated circuit of the future assembly is designed.

This original wafer is tested to identify the appropriate portions. Next, the original wafer is diced and, according to FIG. 5b, the appropriate portions 102 are arranged on a tape, forming a reconstructed wafer 103.

Various elements are added to this reconstructed carrier 103 to form a complete electronic assembly. First, interposers are added, in order to provide an electrical connection between the portions in good condition and the future substrate where the assembly will be connected.

Next, the surface of the reconstructed carrier receives a packaging, in order to secure each portion of the carrier and to handle the reconstructed carrier as one piece. The reconstructed carrier is then ground to expose the silicon of the well-conditioned portions, so that the metal layers may be added. These metal layers make it possible to control deformation and to provide the electrical connections between the terminals of the integrated circuit and the terminals of the assembly. Once these layers have been added, the reconstructed carrier is ready to receive the LED population.

The installation of the redistribution layers at an early stage in the process, independently of the final connection of the assembly, as a sub-assembly or SMD, makes the process easier and less expensive, since yield is improved, and the final assembly of the heat sink elements is also improved.

FIG. 5c shows the final result of the reconstructed carrier 103 after having undergone the preceding steps. All of the required electronic elements are arranged so as to form an assembly of light sources according to the invention.

Once the LEDs have been arranged in the reconstructed carrier, a reflow process takes place, followed by underfill deposition between the micro LEDs and the conductive portions. Next, the array of micro LEDs is treated and ready to be tested and isolated.

The elements of the exemplary embodiments are systematically denoted by the same reference numerals throughout the drawings and detailed description, where applicable:

1 Assembly of light sources
2 Integrated circuit
21 First side of the integrated circuit
22 Second side of the integrated circuit
23 Pad of the integrated circuit
24 Anode
25 Cathode
3 Micro-LED
31 Micro-LED pad
4 Active surface
5 fan-out packaging
6 First multilayer metal layer
61 Redistribution layers
62 Wire
63 Polymer through-via
64 Passivation layer
7 Connection pad
71 First polymer
72 Second polymer
73 Third polymer
8 Second metal layer
81 Contact portions of the second metal layer
9 Tie layer
10 Motor vehicle lighting device
11 Heat sink
12 Printed circuit board
13 Intermediate thermal layer
101 Initial carrier
102 Appropriate portions
103 Reconstructed carrier

What is claimed is:

1. An assembly of light sources for a motor vehicle lighting device, the assembly comprising:
   an integrated circuit with a first side and a second side opposite the first side, with a first connection pad in the first side;
   a light-emitting part with a plurality of micro semiconductor light sources which are electrically connected to the first side of the integrated circuit and an active surface arranged so as to modify the wavelength of the micro semiconductor light sources;
   a fan-out packaging, surrounding at least part of the integrated circuit;
   a first multilayer metal layer arranged so as to cover at least part of the first side of the integrated circuit, providing an electrical connection between the first connection pad and a connection pad of the assembly;
   a second metal layer including contact portions which are in direct contact with the second side of the integrated circuit;
   a heat sink element;
   an array bonding layer arranged between the second metal layer and the heat sink element; and
   a printed circuit board.

2. The assembly of light sources as claimed in claim 1, wherein the second metal layer includes copper and a finish made of nickel, palladium and gold.

3. The assembly of light sources as claimed in claim 1, wherein the active surface is arranged in a plane that is parallel to the first and second sides of the integrated circuit.

4. The assembly of light sources as claimed in claim 1, wherein the second metal layer is parallel to the active surface.

5. The assembly of light sources as claimed in claim 1, wherein a distance between the connection pad of the assembly and the active surface is between 2 mm and 4 mm.

6. The assembly of light sources as claimed in claim 1, wherein the second side of the integrated circuit is partially covered by the fan-out packaging, and the second metal layer comprises metal projections which pass through the fan-out packaging to come into contact with the second side of the integrated circuit.

7. The assembly of light sources as claimed in claim 1, wherein the first multilayer metal layer includes at least one redistribution layer.

8. The assembly of light sources as claimed in claim 7, wherein the redistribution layer is arranged around the light-emitting part.

9. The assembly of light sources as claimed in claim 1, wherein the first multilayer metal layer includes a ribbon cable which connects the connection pad of the assembly to the printed circuit board.

10. The assembly of light sources as claimed in claim 1, wherein the first multilayer metal layer includes a via which passes through the fan-out packaging and connects the first connection pad to the connection pad of the assembly.

11. The assembly of light sources as claimed in claim 1, wherein the array bonding layer includes at least one element from among a silicone adhesive, a solder alloy, a silver sinter paste or metal fillers.

12. The assembly of light sources as claimed in claim 1, wherein the active layer is a phosphor coating comprising a silicone-based material and metal particles.

13. A motor vehicle lighting device, comprising:
a plurality of assemblies of light sources, with each of the plurality of assemblies of light including:
an integrated circuit with a first side and a second side opposite the first side, with a first connection pad in the first side;
a light-emitting part with a plurality of micro semiconductor light sources which are electrically connected to the first side of the integrated circuit and an active surface arranged so as to modify the wavelength of the micro semiconductor light sources;
a fan-out packaging, surrounding at least part of the integrated circuit;
a first multilayer metal layer arranged so as to cover at least part of the first side of the integrated circuit, providing an electrical connection between the first connection pad and a connection pad of the assembly;
a second metal layer including contact portions which are in direct contact with the second side of the integrated circuit;
a heat sink element;
an array bonding layer arranged between the second metal layer and the heat sink element; and
a printed circuit board.

14. A method for producing an assembly of light sources, the method comprising:
providing an initial integrated circuit carrier;
selecting portions of the initial integrated circuit carrier that are suitable for the production of an assembly of light sources;
placing appropriate portions of an adhesive tape to form a reconstructed carrier;
placing interposers for electrical connection;
selecting the portions of the reconstructed carrier that are suitable for packaging;
grinding the rear face of the reconstructed carrier to define the thickness or to expose a silicon rear face;
adding a second metal layer to the second face of the reconstructed carrier;
adding a first multilayer metal layer to the first face of the reconstructed carrier to create a connection between each of a plurality of integrated circuit pads and each of a plurality of assembly pads;
attaching a plurality of micro semiconductor light sources; and
dicing the reconstructed carrier.

15. The method as claimed in claim 14, further comprising:
reflowing process after attaching micro semiconductor light sources;
underfilling deposition between the micro semiconductor light sources and the reconstructed carrier;
performing treatments on the micro semiconductor light sources; and
performing opto-electrical tests.

16. The method as claimed in claim 15, wherein the performing treatments includes performing a surface treatment.

17. The method as claimed in claim 15, wherein the performing treatments includes performing a thinning treatment.

* * * * *